United States Patent [19]

Yamazaki

[11] Patent Number: 5,596,206
[45] Date of Patent: Jan. 21, 1997

[54] SUPERCONDUCTING DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 416,474

[22] Filed: Apr. 4, 1995

Related U.S. Application Data

[63] Continuation of Ser. No. 151,775, Nov. 15, 1993, abandoned, which is a continuation of Ser. No. 819,633, Jan. 10, 1992, abandoned, which is a continuation of Ser. No. 512,513, Apr. 19, 1990, abandoned, which is a continuation of Ser. No. 167,987, Mar. 14, 1988, abandoned.

[30] Foreign Application Priority Data

| Mar. 13, 1987 | [JP] | Japan | 62-58141 |
| Mar. 17, 1987 | [JP] | Japan | 62-63475 |
| Mar. 23, 1987 | [JP] | Japan | 62-69450 |

[51] Int. Cl.$^6$ ................................. H01L 29/06
[52] U.S. Cl. ................... 257/30; 257/33; 257/35; 257/36; 257/39; 257/661; 257/663; 505/193; 505/234; 505/236; 505/703
[58] Field of Search .............. 357/5, 65; 505/1, 505/193, 234, 236, 330, 703; 257/31–36, 39, 661–3

[56] References Cited

U.S. PATENT DOCUMENTS

| 3,643,237 | 2/1972 | Anacker | 257/36 |
| 4,589,001 | 5/1986 | Sakai et al. | 357/5 |
| 4,880,771 | 11/1989 | Cava et al. | 505/1 |

FOREIGN PATENT DOCUMENTS

| 58-71673 | 4/1983 | Japan | 357/5 |
| 59-154084 | 9/1984 | Japan | 357/5 |
| 60-7187 | 6/1985 | Japan | 357/5 |
| 61-206279 | 9/1986 | Japan | 357/5 |

OTHER PUBLICATIONS

E. M. Engler, "Superconductivity at accessible temperatures," *Chemtech* (Sep. 1987) pp. 542–551.
"Compound System at Ambient Presseers" *Physical Review Letters*, vol. 58 (Mar. 1987) pp. 908–910.
P. H. Hor et al., "High–Pressure Study of the New Y–Ba–Cu–O Superconducting Compound System," *Physical Review Letters*, vol 58 (Mar. 1987) pp. 91–92.
R. H. Koch et al., "Thin films and SQUIDS made from $YBa_2Cu^3Oy$" Materials Research Society Conference (Apr., 1987) pp. 81–84.
Y. Saito et al., "Properties of the superconductor (Sr, Ca)–La–Cu–O system," *Japanese Journal Applied Physics*, vol. 26 (Apr. 1987) pp. L336–L367.
M. K. Wu et al., "Superconductivity at 90K in a new mixed–phase Y–Ba–Cu–O."

*Primary Examiner*—J. Carroll
*Attorney, Agent, or Firm*—Sixbey, Friedman, Leedom & Ferguson, P.C.; Gerald J. Ferguson, Jr.; Jeffrey L. Costellia

[57] ABSTRACT

A new type of superconducting device is disclosed. The device embodies a superconducting ceramic film as an active part. A control electrode is provided on the superconducting film in which a passing current is controlled by applying a voltage on an intermediate portion of the film.

13 Claims, 9 Drawing Sheets

SUPERCONDUCTING DEVICE

This application is a Continuation of Ser. No. 08/151,775, filed Nov. 15, 1993, now abandoned, which was a Continuation of Ser. No. 07/819,633, filed Jan. 10, 1992, now abandoned, which was a Continuation of Ser. No. 07/512,513, filed Apr. 19, 1990, now abandoned, which was a Continuation of Ser. No. 07/167,987, filed Mar. 14, 1988, now abandoned.

BACKGROUND OF THE INVENTION

This invention relates to a superconducting device.

The Josephson devices such as a memory which functions in virtue of the Josephson effect are known as superconductive electronical devices. In this device, a channel is closed or opened arbitorarily under the Josephson effect. The advantege of the device is operability at a very high frequency. However, this type of superconducting device requires somewhat complex design and possesses no amplification function.

SUMMARY OF THE INVENTION

It is therefore an object of the invention to provide a new type of superconducting electronical device.

It is another object of the present invention to provide a superconducting amplifier.

In accordance with one aspect of the invention, a superconducting film is provided with a pair of barrier films at the both ends and with a control electrode fromed on the film through an insulating film between the barrier films. The barrier films are designed to endow a unidirectionality to the device with respect to the current passing from one barrier to the other. For instance, the barriers deffer in potential height or width. The barriers have to prevent the applied voltage from influencing outside of the supercondicting film therebetween, while allowing the tunnel effect over the barriers. The insulating film between the control electrode and the underlying superconducting film is formed so thinner as not to substantially lower the Tc. The current allowed to pass through the superconduting film is controlled by applying a voltage to the film.

In accordance with another aspect of the invention, intermediate states of superconductivity (partially of superconductive and partially of normal conductivity) are utilized which have been obverved particularly in superconducting ceramics. The intermediate state is establised in a superconducting film and subjected to a control voltage by means of a control electrode, which is formed on the superconducting film with an insulating film therebetween. The insulating film has a resistivity ten or more times higher than that of the superconducting film generally made of ceramics. Such superconduting ceramics are characterized by layered atomic structures. When formed on the substrate, the superconduting film is fabricated with its layered structure in parallel with the underlying substrate. In what follow, several embodiments are described with superconducting materials of ceramic oxides. However, other type of superconducting materials can be used as long as the Tc and the Tc onset is separated, e.g. by 10° K.

BRIEF DESCRIPTION OF THE INVENTION

FIGS. 1(A) to 1(C) are cross section views showing a first embodiment of the present invention and variations thereof.

FIGS. 2(A) to 2(C) are explanatory energy diagrams showing the operation of the first embodiment of the present invention.

FIGS. 3(A) to 3(C) are explanatory energy diagrams showing the operation of the modified device of the first embodiment.

FIGS. 4(A) to 4(C) are cross section views showing a second embodiment of the present invention and variations thereof.

FIGS. 5(A) to 5(C) are explanatory energy diagrams showing the operation of the second embodiment of the present invention.

FIG. 6 is a graphical diagram showing the relationship between the resistivity and the temperature of superconducting ceramics.

FIGS. 7(A) to 7(C) are cross section views showing a third embodiment of the present invention and variations thereof.

FIGS. 8(A) to 8(C) are explanatory energy diagrams showing the operation of the third embodiment of the present invention.

DETAILED DESCRIPTION OF THE PREFERRED EMBODIMENTS

Figure 1A:
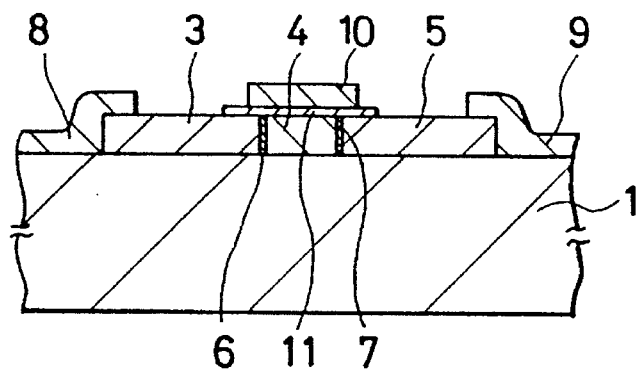

Referring to FIG. 1, a superconducting electronic device in accordance with the present invention is schematically illustrated in cross section. In the figure, first, second and third superconducting thin films 3, 4 and 5 are formed by sputtering or screen press-printing on a substrate made of YSZ (yttria stabilized zircon). The thickness of these superconducting films are chosen 0.01 to 10 microns. Between the first and second superconducting films 3 and 4 and between the second and third superconducting films 4 and 5, insulating films 6 and 7 are disposed in order to form potential barriers such as associated with Josephson junctions. The stoichiometric composition of the superconducting material of the thin film is $(Y_{1-x}Ba_x) CuO_{2.5-3.0}$ where $x=0.01-0.3$, preferably $0.05-0.1$. A control electrode 10 is formed over the second supercoducting film 4 with an insulating film 11 therebetween. The potential barrier of the film 6 is higher than that of the film 7. Also the outer ends of the first and third superconducting films 3 and 5 are in contact with electrodes 8 and 9 respectively thorugh which a current to the superconducting films. These films or electrodes may be patterned by photolithography.

Figure 2A:
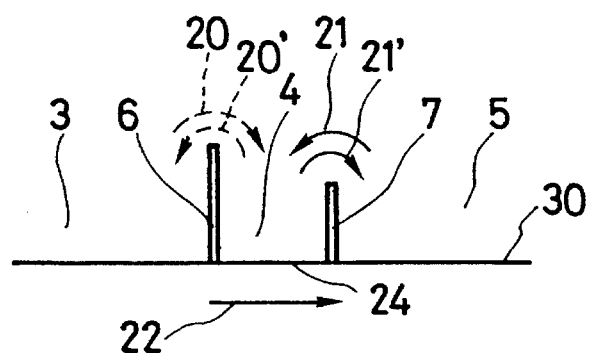
Figure 2B:
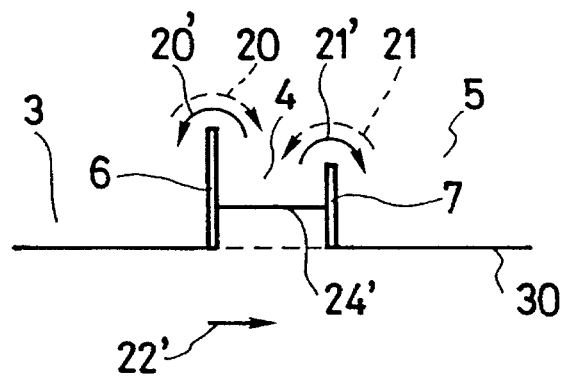
Figure 2C:
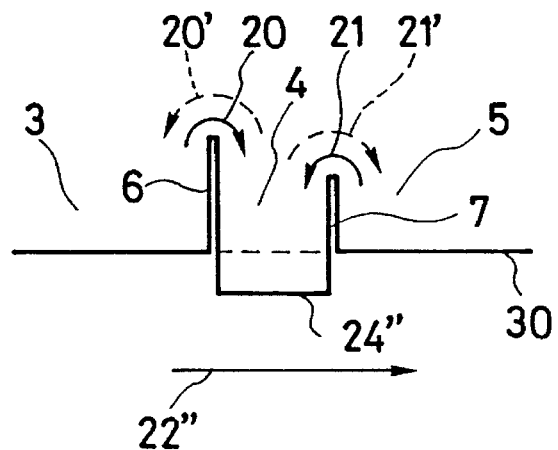

FIGS. 2(A) to (C) are explanatory energy block diagrams showing the electron (cooper pair) motion in the device. FIG. 2(A) is the illustration corresponding to the device given no control signal at the control electrode 10. In the figure, when no current is supplied to the superconducting films, the amplitudes of the wave functions 20 and 20' having right-directed and left-directed momentums over the insulating barrier 6 are equal. For the same reason, the amplitudes of the wave functions 21 and 21' having right-directed and left-directed momentums over the insulating barrier 7 are equal. When a current 22 is supplied to the device, the differential amplitude between the functions 20 and 20' (21 and 21') allows a current flow 22.

When an negative voltage is applied to the control electrode 10, the condition of the device is depicted in the diagram shown in FIG. 2(B). Because of the differential energy level between the both sides of the barrier 6(7), the wave function 20'(21') is enhanced in comparison with the wave function 20(21). The barrier 6 impedes carriers moving from the left to the right thereover in correspondence with the wave function 20. Conversely, when a positive voltage is applied to the control electrode 10, the condition of the device is depicted by the diagram shown in FIG. 2(C). In this condition, the wave function 20(21) is enhanced in comparison with the wave function 20'(21'). The barrier 6 makes easy carrier to move from the left to the right thereover in correspondence with the wave function 20. In conclusion, the current flowing the superconducting films over the junctions can be controlled by adjusting the voltage applied to the control electrode 10. The current can increase as the voltage at the control electrode 10 is decreased.

Figure 1B:
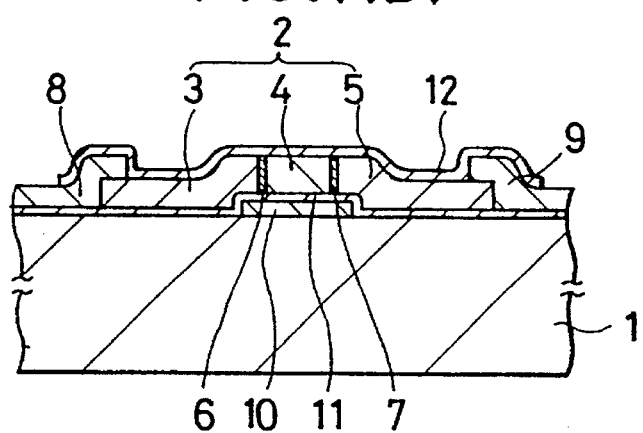
Figure 1C:
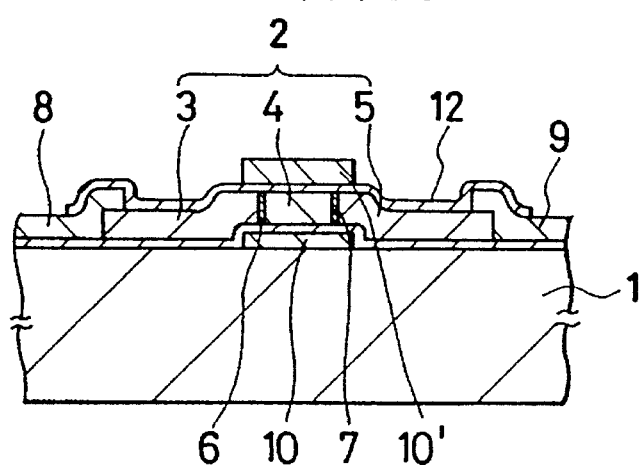

FIGS. 1(B) and 1(C) are cross section views showing modifications of the first embodiment. In FIG. 1(B), the control electrode 10 is provided below the second superconducting film 4 through an insulating film 11. A reference numaral 12 designates a passivation film. In addition to the configuration illustrated in FIG. 1(B), an upper control electrode 10' may be provided on the second superconducting film 4 thorough the insulating film 12 as shown in FIG. 1(C). For the latter modification, the thickness of the superconducting films may be 0.1 to 50 microns which is about five times as thick as that used in the device provided with a control electrode only on one side of the superconducting film. The sensitivity of the superconducting film is improved with a smaller thickness, so that the thickness is preferably decreased as long as the Tc remain within the temperature range suitable for practice.

Figure 3A:
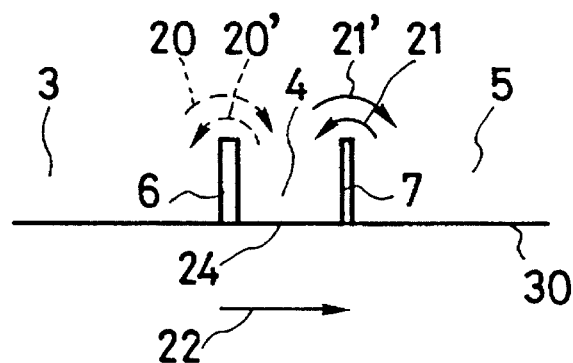
Figure 3B:
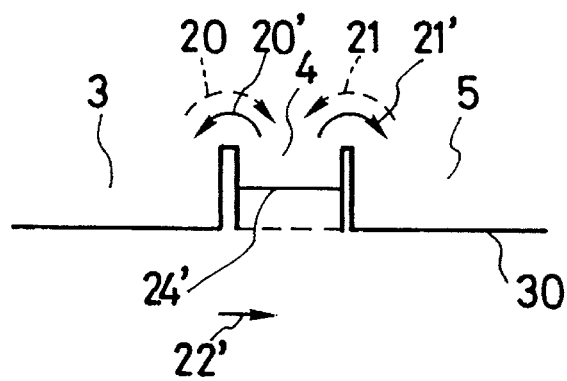
Figure 3C:
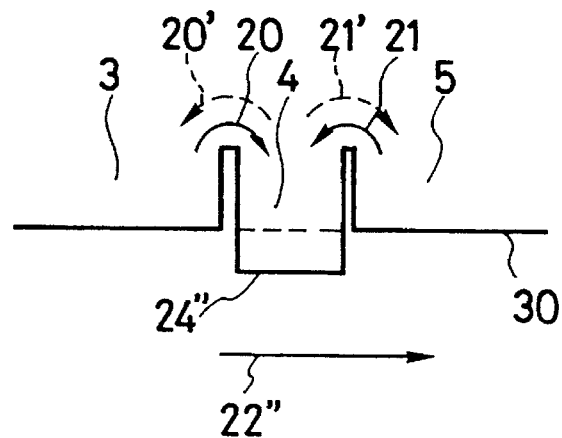

The first embodiment is provided with two barriers 6 and 7 whose potential heights are different. However, equivalent configuration can be formed by making different the widths of the potential barriers 6 and 7 instead of the heights thereof. The block diagrams are illustrated in FIGS. 3(A) to 3(C) corresponding to FIGS. 2(A) to 2(C). The above explanation can be applied in the same manner also to the action in conjunction with these diagrams.

Figure 4A:
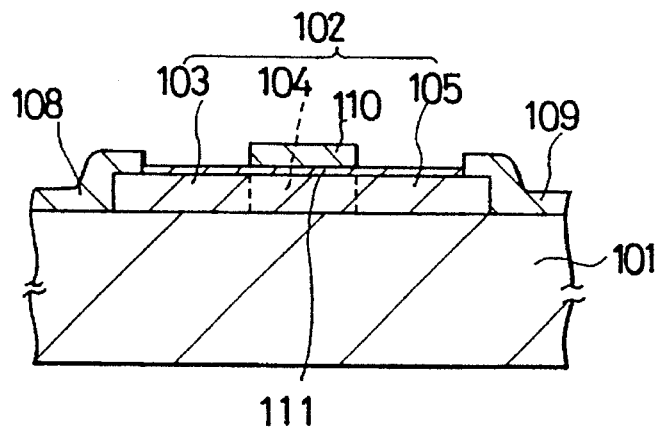

Referring to FIG. 4(A), another superconducting electronic device in accordance with the present invention is schematically illustrated to show a second embodiment. In the figure, a superconducting thin film 102 consisting of first, second and third regions 103, 104 and 105 is formed by sputtering or screen press-printing on a substrate made of YSZ (yttria stabilized zircon). The stoichiometric composition of the superconducting material of the thin film is $(Y_{1-x}Ba_x)CuO_{2.5-3.0}$ where $x=0.01-0.3$, preferably 0.05–0.1. At the same time or after the formation, the superconducting film is subjected to thermal annealing at 600–900° C. for 5–10 hours. A control electrode 110 is formed over the second supercoducting region 104 with an insulating film therebetween. Also the outer edges of the first and third superconducting regions 103 and 105 are in contact with respective electrodes 108 and 109. The electrodes are made of copper or compounds of copper and nickel and formed by vapor depostition. The electrodes 108 and 109 have to make ohmic contact with the superconducting film 103 and 105. If the electrode includes copper, a good contact is expected because the superconducting film is made of a ceramic which is abundant in copper. These films or electrodes may be patterned by photolithography.

Figure 6:
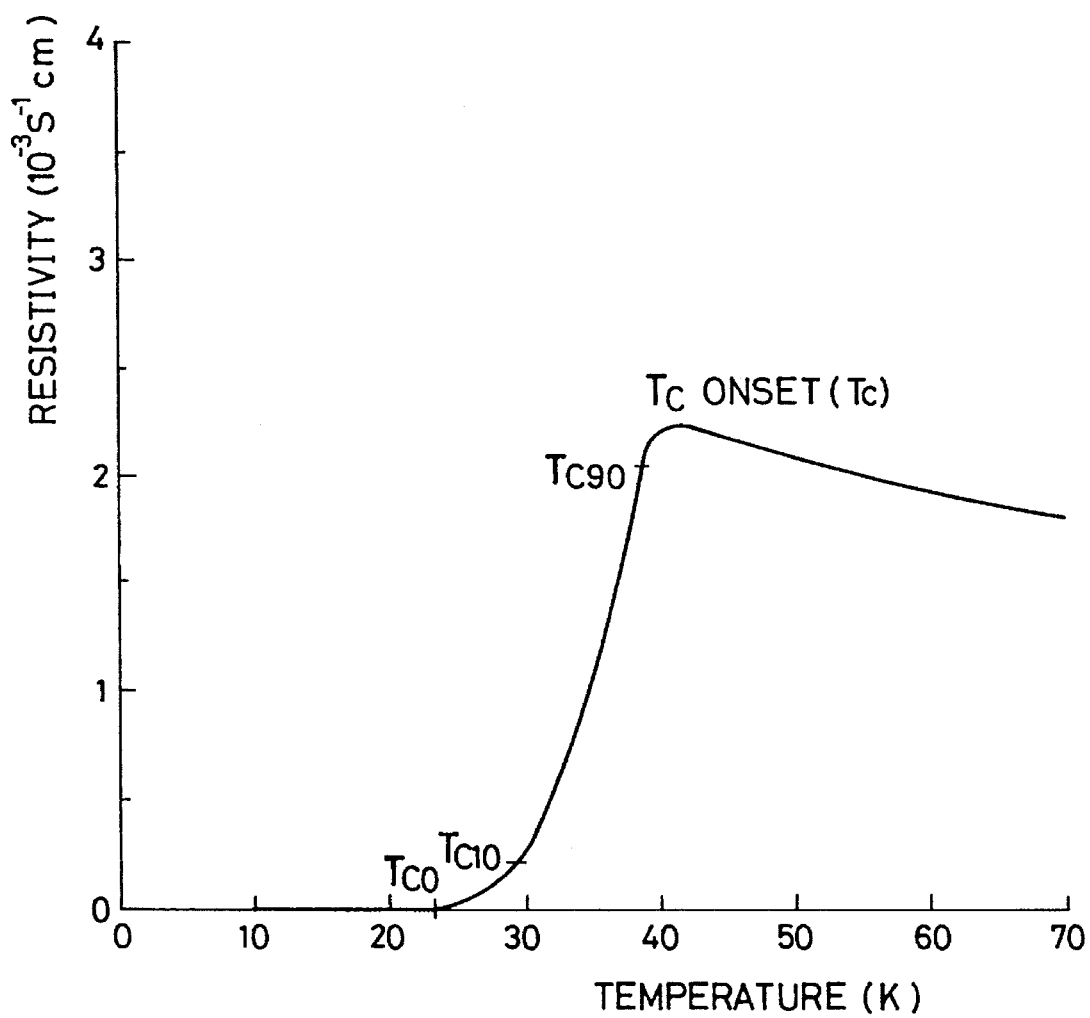

FIG. 6 is a graphical diagram showing the relationship between the resistivity and the temperature of superconducting ceramics. The transition from a normal conductivity to a superconductivity is initiated from the Tc onset temperature and completed at the Tco where the resistivity vanishes. In this description, the temperature higher than Tco by x % of the range between Tc onset and Tco is called $Tc_x$. $Tc_{100}$ is the Tc onset for example. This embodiment is operated at an intermediate temperature between Tco and Tc onset. For stabilized operation, the temperature is selected between $Tc_{10}$ and $Tc_{90}$, e.g. $Tc_{50}$.

Figure 5A:
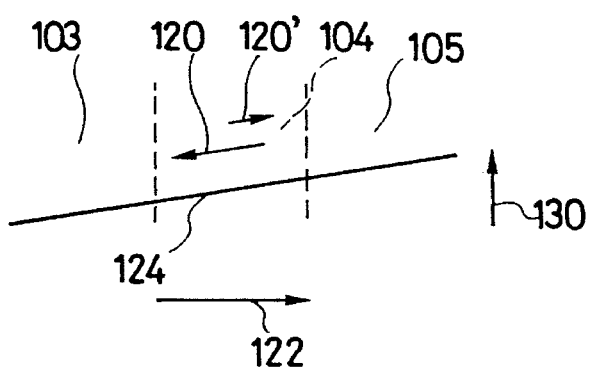
Figure 5B:
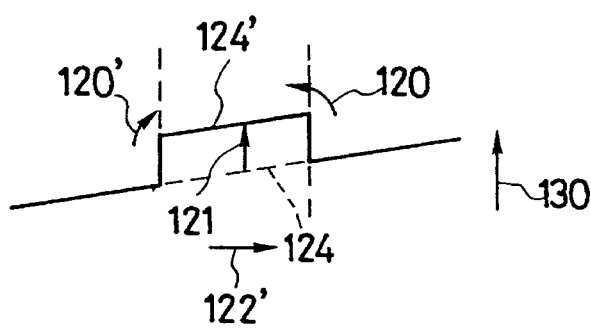
Figure 5C:
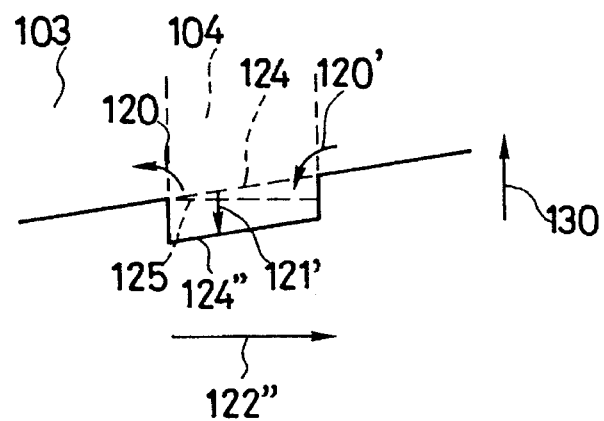

FIGS. 5(A) to 5(C) are explanatory energy block diagrams showing the electron motion in the device. FIG. 6(A) is the illustration corresponding to the device given no control signal at the control electrode 110. In the figure, when a voltage (current) is applied between the electrodes 108 and 109, the amplitudes of the wave functions 120 and 120' having right-directed and left-directed momentums are different in order to produce a current 122.

The condition of the device, when an negative voltage is applied to the control electrode 110, is illustrated in the diagram shown in FIG. 6(B). Because of the high energy level 124' of the region 4 appearing as a potential barrier, the flow of the wave function 120' is impeded so that the resulting current diminishes. Conversely, the condition of the device, when a positive voltage is applied to the control electrode 110, is depicted to the diagram shown in FIG. 6(C). In this condition, the wave function 120' is enhanced while the wave function 120 is suppressed. However, the well 124" thus formed is filled up with electrons just after the formation and, eventually deformed into the flat level depicted by a dashed line 125. As a result, the current 122" passing through the device is same as the current 122 of the condition illustrated in FIG. 6(A). In conclusion, the current flowing the superconducting films over the junctions can be controlled by adjusting a voltage applied to the control electrode 110.

Figure 4B:
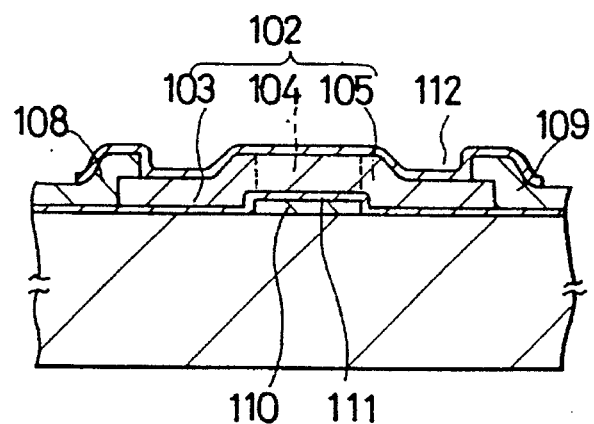
Figure 4C:
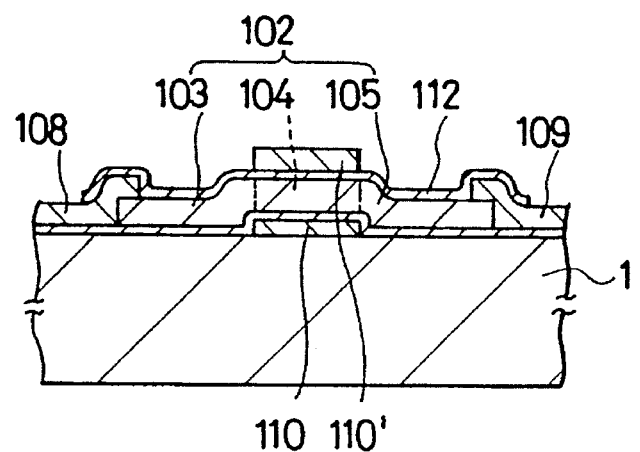

FIGS. 4(B) and 4(C) are cross section views showing modifications of the second embodiment. In FIG. 4(B), the control electrode 110 is provided below the second superconducting film 4 through an insulating film 111. A reference numaral 112 designates a passivation film. In addition to the configuration illustrated in FIG. 4(b), an upper control electrode 110' is provided on the second superconducting film 104 thorough the insulating film 12 as shown in FIG. 4(c).

Figure 7A:
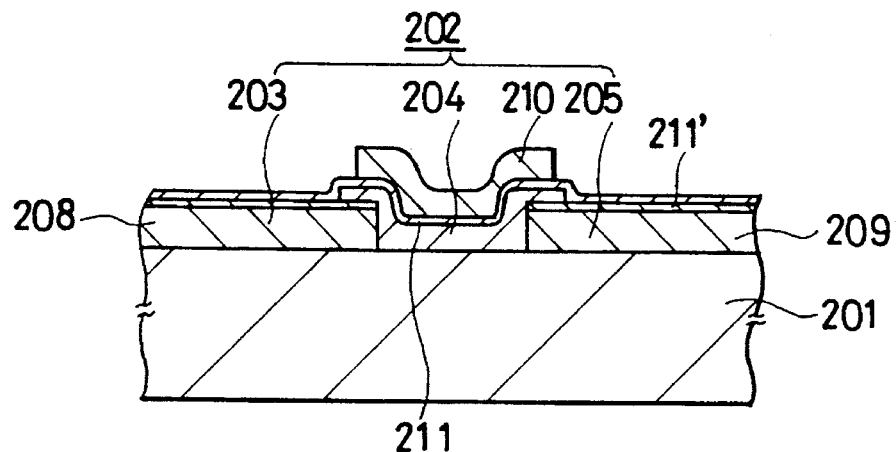

Referring to FIG. 7(A), a further superconducting electronic device in accordance with the present invention is schematically illustrated in crocc section to show a third embodiment. In the figure, first, second and third superconducting thin films 203, 204 and 205 are formed by sputtering, screen press-printing, a MBE (Molecular Beam Epitaxial) method, a CVD method, a high-speed rapid-cooling method, or the like. On a substrate made of YSZ (yttria stabilized zircon). First, a superconducting thin film is deposited on the substrate. The stoichiometric composition of the superconducting material of the thin film is $(Y_{1-x}Ba_x)CuO_{2.5-3.0}$ where $x=0.01-0.3$, preferably 0.05–0.1, called YBCO hereinafter. At the same time or after the formation, the superconducting film is subjected to thermal annealing at 600°–1200° C. for 5–10 hours. Then, an insulating film 211' is formed and pattered on a prescribed portion of the superconductive film, followed by etching of the superconducting film with the insulating film as a mask to produce the first and second superconducting films 203 and 205.

On the portion of the substrate 201 between the first and third superconducting films 203 and 205, the second superconducting film 202 is formed by the same process of the first and second films 203 and 205 but using a different material. The superconducting ceramics taken in mind in the preferred embodiments are represented by the two formulae shown in the last of the description. The formulae include several parameters to define a concrete composition. The compositions of the first and third superconducting film and the second superconducting film are chosen so that the second film 204 has a critical temperature lower than that of the first and third films 203 and 205. Preferably, the two compositions differ only in the parameters but not in the kind of elements selected.

Figure 9:
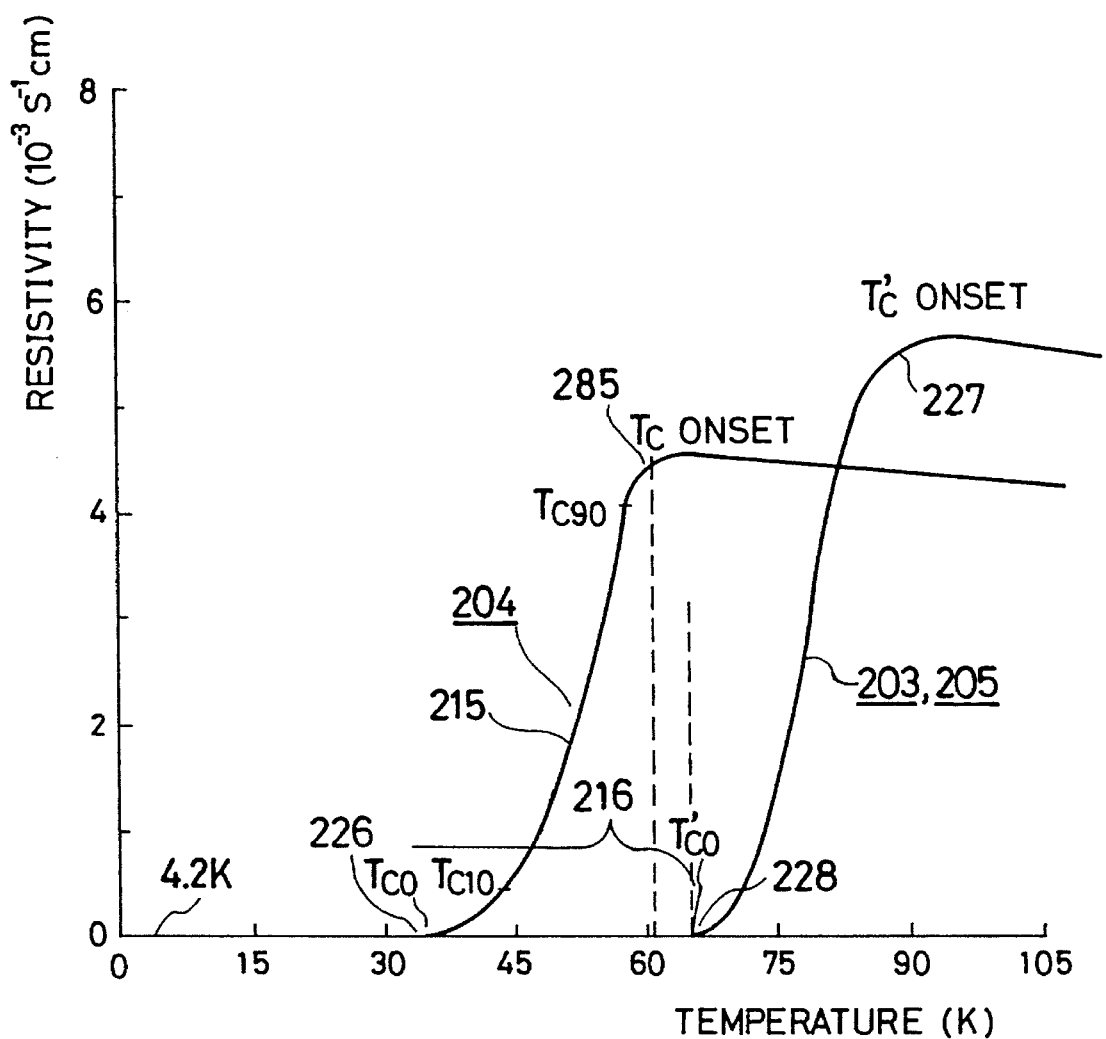
FIG. 9 is a graphical diagram showing the relationship between the resistivity and the temperature of superconducting ceramics in accordance with the present invention.

In accordance with the experimental using YBCO for the first, second and third films (in reality, some proportion of Ba was replaced by Sr), superconducting properties characterized by the graphical diagrams illustrated in FIG. 9 were obtained.

Next, a control electrode 210 is formed over the second supercoducting film 204 with an insulating film 211 therebetween. Also the outer edges of the first and third superconducting films 203 and 205 are in contact with respective electrodes 208 and 209. The electrode is made of a metallic material such as copper or compounds of copper and nickel and formed by vapor deposition. The electrodes 208 and 209 have to make ohmic contact with the superconducting films. If the electrode includes copper, the contact becomes good because the superconducting film is made of a ceramic which is abundant in copper. These films or electrodes may be patterned by photolithography. In the foregoing description, the second superconducting film 204 can be formed after the formation of the first and third superconducting films 203 and 205 instead.

FIG. 9 is a graphical diagram showing the relationship between the resistivity and the temperature. The left curve shows the property of the second film 204 while the left curve shows the property of the first and third films 203 and 205. This embodiment is operated at an intermediate temperature between the Tco (226) and the Tc onset (225) of the second superconducting film 204. For stabilized operation, the temperature is selected between $Tc_{10}$ and $Tc_{90}$, e.g. $Tc_{50}$.

Figure 7B:
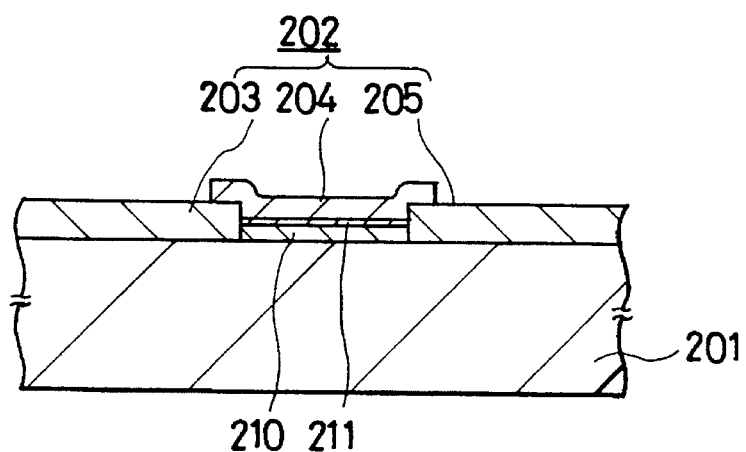
Figure 8A:
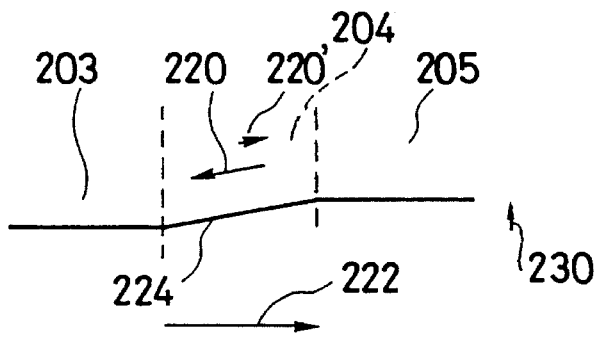
Figure 8B:
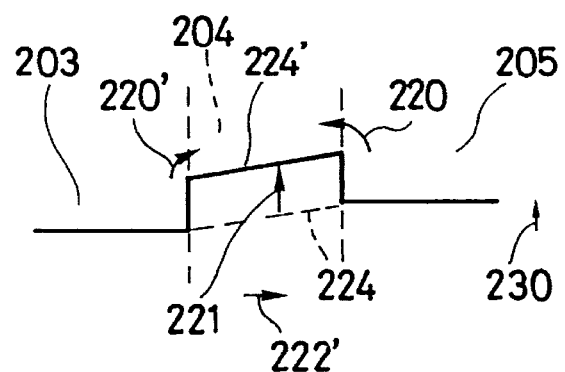
Figure 8C:
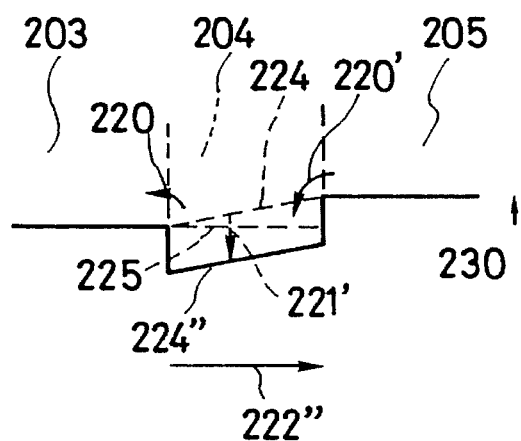

FIGS. 8(A) to 8(C) are explanatory energy block diagrams showing the electron motion in the device. FIG. 8(A) is the illustration corresponding to the device given no control signal at the control electrode 210 of FIG. 7(B). In the figure, when a voltage (current) is applied between the electrodes 208 and 209, the amplitudes of the wave functions 220 and 220' having right-directed and left-directed momentums are different in order to produce a current 222.

Figure 10:
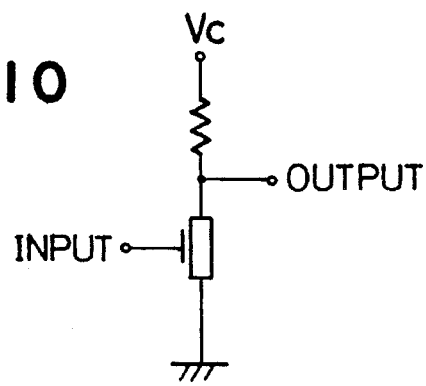
FIG. 10 is a diagram showing an inverter as an application of the present invention.

The condition of the device, when an negative voltage is applied to the control electrode 210, is illustrated in the diagram shown in FIG. 8(B). Because of the high energy level 224' appearing as a potential barrier, the flow of the wave function 220' is impeded so that the resulting current 222' diminishes. Conversely, the condition of the device, when a positive voltage is applied to the control electrode 210, is depicted to the diagram shown in FIG. 8(C). In this condition, the wave function 220' is enhanced while the wave function 220 is suppressed. However, the well 224" thus formed is filled up with electrons just after the formation and, eventually deformed into the flat level depicted by a dashed line 225. As a result, the current 222" passing thorugh the device is same as the current 222 of the condition illustrated in FIG. 5(A). In conclusion, the current flowing through the superconducting films can be controlled by adjusting a voltage applied to the control electrode 210. Applying an input signal to the control electrode 210 and receiving the current passing thorugh the superconducing films as an output signal, the device can be used as an amplifier having four terminals. Also, by connecting with a resistor as illustrated in FIG. 10, an inverter can be constructed in which the device is used as a switch.

Figure 7C:
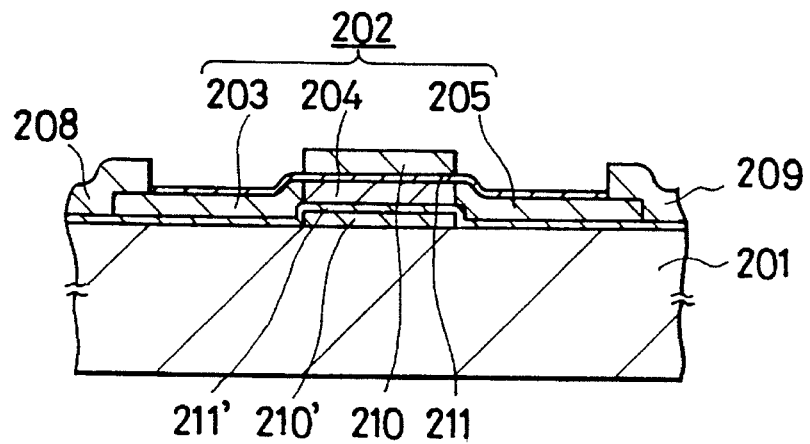

FIGS. 7(B) and 7(C) are cross section views showing modifications of the second embodiment. In FIG. 7(B), the control electrode 210 is provided below the second superconducting film 204 with an insulating film 211 therebetween. In FIG. 7(C), an upper control electrode 210 and a lower control electrode 210' are formed on the both sides of the second superconducting film 204 through the insulating films 211 and 211'.

Superconducting ceramics for use in accordance with the present invention also may be prepared consistent with the stoichiometric formulae $(A_{1-x}B_x)_yCu_zO_w$, where A is one or more elements of Group IIIa of the Priodic Table, e.g., the rare earth elements, B is one or more elements of Group IIa of the Periodic Table, e.g., the alkaline earth metals including beryllium and magnesium, and x=0–1; y=2.0–4.0, preferably 2.5–3.5; z =1.0–4.0, preferably 1.5–3.5; and w=4.0–10.0, preferably 6.0–8.0, e.g. $YBa_2Cu_3O_{6-8}$. Also, superconducting ceramics for use in accordance with the present invention may be prepared consistent with the stoichiometric formulae $(A_{1-x}B_x)_yCu_zO_w$, where A is one or more elements of Group Vb of the Priodic Table such as Bi, Sb and As, B is one or more elements of Group IIa of the Periodic Table, e.g., the alkaline earth metals and x=0.3–1; y=2.0–4.0, preferably 2.5–3.5; z=1.0–4.0, preferably 1.5–3.5; and w=4.0–10.0, preferably 6.0–8.0, e.g. $BiCaSrCu_2O_x'$ (x' may be smaller than that of the former case).

In this description, the term "superconducting" is used to direct the property of material that superconductivity arise when the temperature is below the Tc. Also, Group IIIa and Group Va is directed to a group consisting of transition elements as shown in "Phisics and Chemistry Dictionary" published by Iwanami, Apr. 1st, 1963 Japan. In this connection, Group IIIa and Group Va consists of typical elements in "The Penguin Dictionary of Science" published by Penguin Books. In this description, the former definitions are employed. Namely, the transition elements belonging to Group IIIa and the tipical elements belonging to Group Vb are used in the present invention.

While a description has been made for several embodiments, the present invention should be limited only by the appended claims and should not be limited by the particualr examles. What follows are some examples of modifications and variation according to the invention.

I claim:

1. A superconducting device comprising:

a superconducting film formed on a substrate, the superconducting film including at least two regions having a different Tc from one another; and a control electrode formed adjacent a portion of the superconducting film in order to control a current passing across the at least two regions in the superconducting film.

2. A superconducting device comprising:

a superconducting film comprising a high-Tc copper oxide superconducting material formed on a substrate, said superconducting film including at least two regions having a different Tc from one another; and a control electrode formed adjacent a portion of said superconducting film in order to control a current passing across said at least two regions in said superconducting film.

3. The device of claim 1 wherein said superconducting film comprises a material represented by a general formula:

$$(A_{1-x}B_x)_y Cu_z O_w$$

where A is one or more elements selected from the group consisting of Sc, Y, Lanthanide series, and Actinide series; B is one or more elements selected from the group consisting of Be, Mg, Ca, Sr, Ba and Ra; and
where $0<x<1$, $2<y<4$, $1<z<4$, and $4<w<10$.

4. The device of claim 1 wherein said superconducting film comprises a material represented by a general formula:

$$(A_{1-x}B_x)_y Cu_z O_w$$

where A is one or more elements selected from the group consisting of N, P, As, Sb and Bi; B is one or more elements selected from the group consisting of Be, Mg, Ca, St, Ba and Ra; and
where $0.3<x<1$, $2<y<4$, $1<z<4$, and $4<w<10$.

5. The device of claim 1 where said superconducting film has upper and lower surfaces and the control electrode is formed adjacent at least one of the upper and lower surfaces.

6. The device of claim 5 including two control electrodes respectively formed adjacent said upper and lower surfaces.

7. The device of claim 2 wherein an insulating film interposed between said control electrode and said superconducting thin film.

8. A superconducting device comprising:
first and second superconducting films formed on a substrate;
a third superconducting film formed on said substrate extending between and in contact with said first and second superconducting films;
a control electrode formed adjacent to said third superconducting film; and
an interlayer film formed between said control electrode and said third superconducting film for isolating said third superconducting film from said control electrode, wherein said third superconducting film has Tc and Tc(0) lower than that of the first and second superconducting films, and said superconducting device is operated at an intermediate temperature between said Tc and Tc(0) of the third superconducting film.

9. The device of claim 8 wherein said superconducting film comprises a material represented by a general formula:

$$(A_{1-x}B_x)_y Cu_z O_w$$

where A is one or more elements selected from the group consisting of Sc, Y, Lanthanide series, and Actinide series; B is one or more elements selected from the group consisting of Be, Mg, Ca, Sr, Ba and Ra; and
where $0<x<1$, $2<y<4$, $1<z<4$, and $4<w<10$.

10. The device of claim 8 wherein said superconducting film comprises a material represented by a general formula:

$$(A_{1-x}B_x)_y Cu_z O_w$$

where A is one or more elements selected from the group consisting of N, P, As, Sb and Bi; B is one or more elements selected from the group consisting of Be, Mg, Ca, Sr, Ba and Ra; and
where $0.3<x<1$, $2<y<4$, $1<z<4$, and $4<w<10$.

11. The device of claim 8 where said third superconducting film has upper and lower surfaces and the control electrode is formed adjacent at least one of the upper and lower surfaces.

12. The device of claim 11 including two control electrodes respectively formed adjacent said upper and lower surfaces.

13. The device of claim 7 wherein said superconducting film comprises a pair of high Tc regions and a low Tc region disposed between said pair.

* * * * *